(12) United States Patent
Goh et al.

(10) Patent No.: US 11,658,127 B2
(45) Date of Patent: May 23, 2023

(54) RFI FREE PICTURE FRAME METAL STIFFENER

(71) Applicant: Intel Corporation, Santa Clara, CA (US)

(72) Inventors: Eng Huat Goh, Ayer Itam (MY); Jiun Hann Sir, Gelugor (MY); Khang Choong Yong, Puchong (MY); Boon Ping Koh, Seberang Jaya (MY); Wil Choon Song, Bayan Lepas (MY); Min Suet Lim, Gulugor (MY)

(73) Assignee: Intel Corporation, Santa Clara, CA (US)

( * ) Notice: Subject to any disclaimer, the term of this patent is extended or adjusted under 35 U.S.C. 154(b) by 815 days.

(21) Appl. No.: 16/454,423

(22) Filed: Jun. 27, 2019

(65) Prior Publication Data

US 2020/0411448 A1 Dec. 31, 2020

(51) Int. Cl.
*H01L 23/552* (2006.01)
*H01L 23/00* (2006.01)
*H01L 23/498* (2006.01)

(52) U.S. Cl.
CPC ...... *H01L 23/552* (2013.01); *H01L 23/49805* (2013.01); *H01L 23/49816* (2013.01); *H01L 24/09* (2013.01)

(58) Field of Classification Search
CPC ............. H01L 23/552; H01L 23/49805; H01L 23/49816; H01L 24/09

USPC ......................................................... 257/659
See application file for complete search history.

(56) References Cited

U.S. PATENT DOCUMENTS

| | | | | |
|---|---|---|---|---|
| 6,825,556 B2* | 11/2004 | Joshi | ....................... | H01L 23/42 257/773 |
| 8,212,353 B1* | 7/2012 | Wang | ................... | H01L 23/3128 257/E23.101 |
| 2015/0035131 A1* | 2/2015 | Ko | .......................... | H01L 23/16 257/690 |

* cited by examiner

*Primary Examiner* — Phuc T Dang
(74) *Attorney, Agent, or Firm* — Schwabe, Williamson & Wyatt, P.C.

(57) ABSTRACT

Embodiments include semiconductor packages and method of forming the semiconductor packages. A semiconductor package includes a package substrate on a substrate, a die on the package substrate, and a conductive stiffener over the package substrate and the substrate. The conductive stiffener surrounds the package substrate, where the conductive stiffener has a top portion and a plurality of sidewalls, and where the top portion is directly disposed on the package substrate, and the sidewalls are vertically disposed on the substrate. The semiconductor package also includes the substrate that has a plurality of conductive pads, where the conductive pads are conductively coupled to a ground source. The conductive stiffener may conductively couple the package substrate to the conductive pads of the substrate. The top portion may have a cavity that surrounds the die, where the top portion is directly disposed on a plurality of outer edges of the package substrate.

28 Claims, 7 Drawing Sheets

RFI FREE PICTURE FRAME METAL STIFFENER

FIELD

Embodiments relate to packaging electronic devices. More particularly, the embodiments relate to electronic devices with radio-frequency interference (RFI) free picture frame metal stiffeners.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor devices. The drive to scale-down features in ICs such as with ultra-thin packages, while optimizing the performance of each device, however is not without issue.

These ultra-thin packages typically include picture frame metal stiffeners to reduce warpage during the surface-mount technology (SMT) process. With the existing stiffeners used for the ultra-thin packages, these picture frame stiffeners are generally designed with high-speed signals that are routed underneath such stiffeners. This leads to increased risks of electromagnetic interference/radio-frequency interference (EMI/RFI) due to in-proper grounding of the picture frame metal stiffeners.

Currently, stiffener grounding (to package Vss layer) are done thru microvia stitching from the surface of the solder resist to the internal package Vss layer. For example, as the majority of high speed signaling and noisy power delivery networks are routed underneath these metal stiffeners and thru the top layer of the packages, in-proper grounding (to package Vss) typically leads to increased package layer count and RFI/EMI risks, where such metal stiffeners will behave like antennas when improperly grounded. Furthermore, the total count of non-critical to function (NCTF) solder balls are also important to these packages. In existing technologies, the NCTF ball count is typically increased due to larger die/package ratios.

Due to the signal routing density on the package surface, Vss stitching from these metal stiffeners to the packages can only be done on limited locations. In addition, the integrity of the conductive epoxy generally used to bond these stiffeners to the packages is also highly uncertain (or questionable) as there is usually no way to test the continuity of such conductive epoxy integrity post-assembly.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Figure 1:
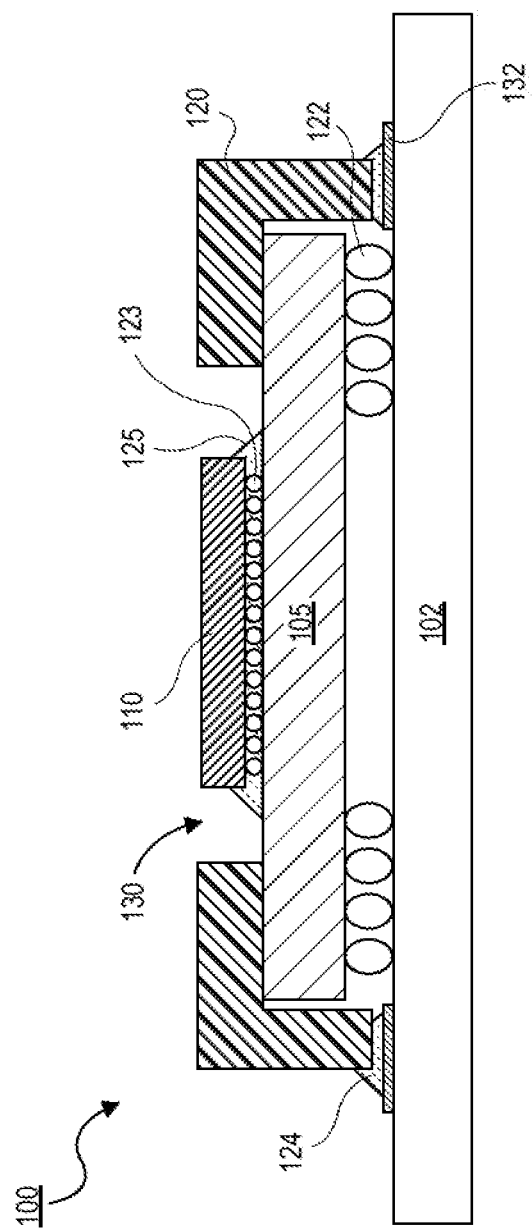
FIG. 1 is an illustration of a cross-sectional view of a semiconductor package with a package substrate, a substrate, a conductive stiffener, a die, and a plurality of conductive pads, where the conductive stiffener is coupled to the package substrate to the plurality of conductive pads of the substrate, according to one embodiment.

Described herein are semiconductor packages (or electronic packages) with conductive stiffeners and methods of forming such semiconductor packages. The semiconductor packages described below and methods of forming such semiconductor packages with a package substrate, a substrate, a conductive stiffener, a die, and a plurality of conductive pads, according to some embodiments. For example, in these embodiments, the conductive stiffeners may be disposed on the package substrate and the substrate. Furthermore, the conductive stiffeners may be extended over portions (or the outer edges) of the package substrate and designed (or shaped/bent) to be directly coupled (or soldered down) to a power layer (e.g., the voltage source supply (Vss) layer) of the substrate (e.g., a printed circuit board (PCB), a motherboard, etc.) during the surface-mount technology (SMT) process or the like (e.g., during the SMT process together with the system-on-chip (SOC) ball grid array (BGA) process), according to some embodiments.

The embodiments described herein provide improvements to existing packaging solutions by enhancing the Vss grounding (or the grounding integrity) between the conductive stiffener and the Vss layer (or the like) of the substrate, and thus substantially reducing (or avoiding/mitigating) the risks of electromagnetic interference/radio-frequency interference (EMI/RFI). Additionally, implementing these conductive stiffeners also enables (or allows) the semiconductor packages described herein to be designed with microstrip routing and improved packaging designs (or design rules), and significantly improve the reliability of the solder interconnects (e.g., specifically at the corners/edges of the substrate(s)) between the package substrate and the substrate. With that none or lesser corner NCTF is required which indirectly translate into smaller package (or more supportable TO). Additionally, the embodiments described herein enable (i) the conductive stiffeners to be conveniently formed with a conventional stamping process (or the like), (ii) the conductive stiffeners to be implemented (or used) as power feeding into the package substrate, (iii) the BGA power balls below the package substrate to be freed up to achieve smaller package size, and (iv) the induced noise coupling to the system antenna to be substantially reduced.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages with package substrates, substrates, conductive stiffeners with different desired shapes/designs, dies, and conductive pads as described herein.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Referring now to FIG. 1, a cross-sectional illustration of a semiconductor package 100 with a package substrate 105, a substrate 102, a die 110, and a conductive stiffener 120 is shown, in accordance with an embodiment. In one embodiment, the semiconductor package 100 may include the conductive stiffener 120 disposed over portions (or top outer surfaces/edges) of the package substrate 105, where the conductive stiffener 120 may couple the package substrate 105 to a plurality of conductive pads 132 of the substrate 102, according to one embodiment.

Figure 2A:
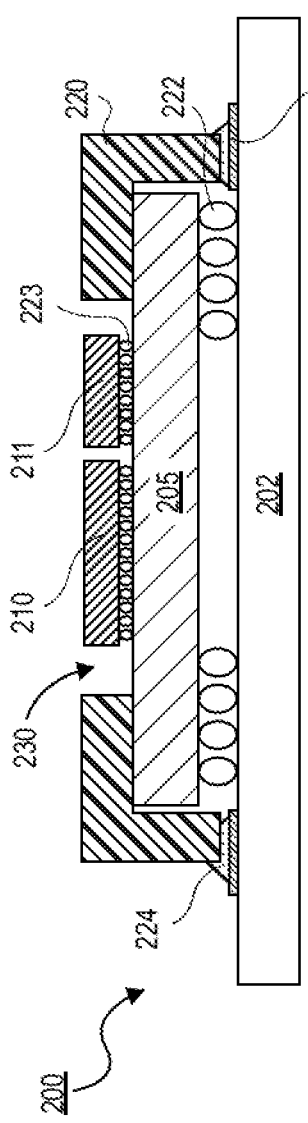
FIG. 2A is an illustration of a cross-sectional view of a semiconductor package with a package substrate, a substrate, a conductive stiffener, a plurality of dies, and a plurality of conductive pads, where the conductive stiffener is coupled to the package substrate to the plurality of conductive pads of the substrate, according to one embodiment.
Figure 2B:
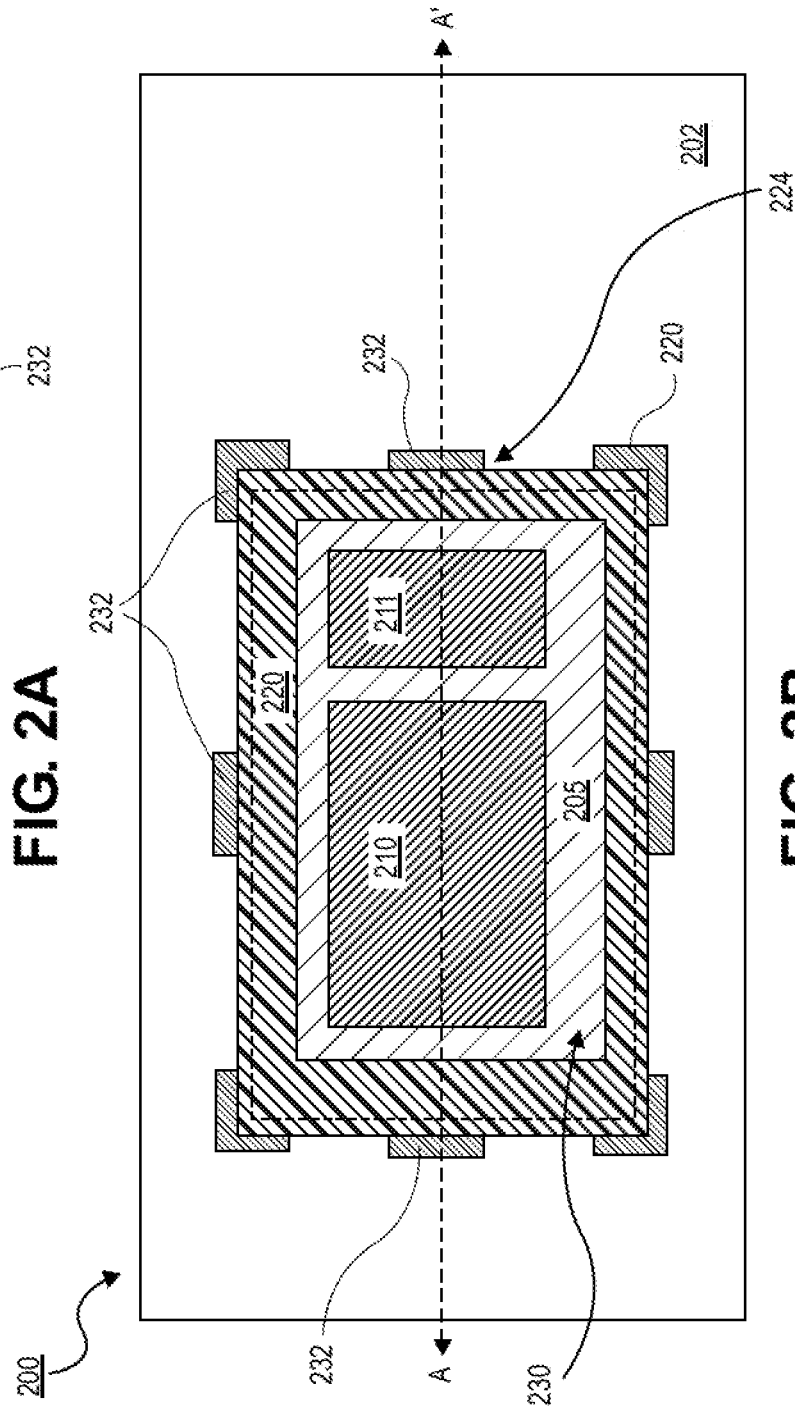
FIG. 2B is an illustration of a plan view of the respective semiconductor package with a package substrate, a substrate, a conductive stiffener, a die, and a plurality of conductive pads, where the conductive stiffener is coupled to the package substrate to the plurality of conductive pads of the substrate, according to one embodiment.

In one embodiment, the die 110 may be disposed on the package substrate 105 and coupled onto the package substrate 105 with a plurality of solder balls 123, where an underfill material 125 may surround the solder balls 123 and portions of the die 110 and the package substrate 105. In some embodiments, the conductive stiffener 120 may have a cavity 130 (or an opening) that surrounds the die 110 (and/or additional dies as shown in FIGS. 2A-2B) over the top surface of the package substrate 105, where the conductive stiffener 120 may have inner edges that extend on/over (and couple to) the top portions of the outer edges of the package substrate 105. In an embodiment, the cavity 130 may have one or more different shapes, including a rectangle, a square, an oval, and/or any other shape (or opening) that may fit (or surround) the total desired number of dies (e.g., as shown with the cavity 330 of FIG. 3C).

Figure 3A:
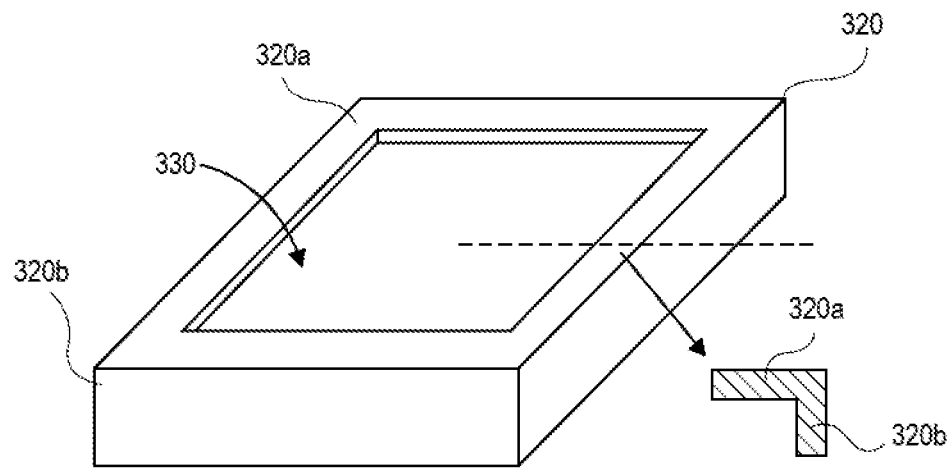
FIGS. 3A-3C are illustrations of perspective and plan views of a plurality of conductive stiffeners having different shapes, according to some embodiments.
Figure 3B:
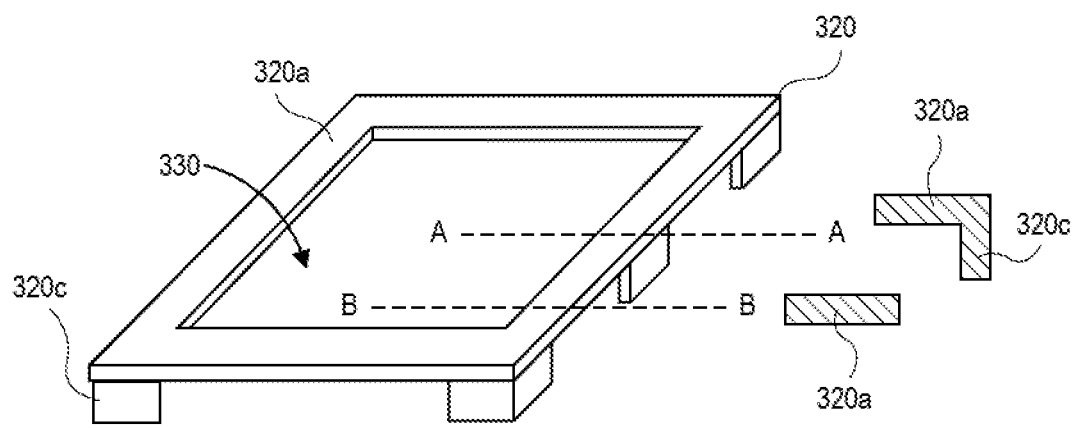

According to some embodiments, the conductive stiffener 120 may have outer walls that completely or partially surround the package substrate 105 (e.g., as shown with the outer walls of conductive stiffeners 320 of FIGS. 3A-3B). In one embodiment, the outer walls of the conductive stiffener 120 may extend vertically over the top surface of the substrate 102, where the conductive stiffener 120 may be conductively coupled to the conductive pads 132 (e.g., the Vss conductive pads) of the substrate 102 with a solder material 124. In one embodiment, the solder material 124 may include solder (or the like) and/or any other similar material such as solder paste materials and so on. In an embodiment, the package substrate 105 may be disposed on the substrate 102 (e.g., a PCB, a motherboard, etc.) and coupled onto the substrate 102 with a plurality of solder balls 122.

For one embodiment, the die 110 may include, but is not limited to, a semiconductor die, an electronic device (e.g., a wireless device), an integrated circuit (IC), a central processing unit (CPU), a microprocessor, a platform controller hub (PCH), a memory, and/or a field-programmable gate array (FPGA). Note that, even if not shown, additional dies may also be disposed on the package substrate 105 and positioned adjacent to the die 110, where such additional dies may be similar/differ to the die 110 in size, footprint, functionality/circuitry, etc. The die 110 may be formed from a material such as silicon and have circuitry thereon that may be coupled to the package substrate 105. The underfill material 125 may be disposed between the die 110 and the package substrate 105. The underfill material 125 may be an epoxy, a mold, or the like.

For one embodiment, the package substrate 105 may include, but is not limited to, a package, a substrate, an interposer (or the like), a PCB, and/or a motherboard. For one embodiment, the package substrate 105 may be a package or the like. For one embodiment, the package is made of an FR-4 glass epoxy base with thin copper foil laminated on both sides. For certain embodiments, a multilayer package can be used, with pre-preg and copper foil used to make additional layers. For example, the multilayer package may include one or more dielectric layers, where each dielectric layer can be a photosensitive dielectric layer. For one embodiment, the package substrate 105 may include a plurality of conductive layers, which may further include copper (or metallic) traces, lines, pads, vias, via pads, holes, and/or planes.

Additionally, for one embodiment, the substrate 102 may include, but is not limited to, a package substrate, a PCB, and/or a motherboard. For one embodiment, the substrate 102 is a motherboard (or the like). For one embodiment, the motherboard is made of an FR-4 glass epoxy base with thin copper foil laminated on both sides. For certain embodiments, a multilayer motherboard can be used, with pre-preg and copper foil used to make additional layers. For example, the multilayer motherboard may include one or more dielectric layers, where each dielectric layer can be a photosensitive dielectric layer. For one embodiment, the motherboard 102 may include a plurality of conductive layers, which may further include copper (or metallic) traces, lines, pads, vias, via pads, holes, and/or planes.

In some embodiments, the conductive stiffeners 120 may be implemented as a conductive structure or frame vertically disposed on the substrate 102, where the conductive stiffeners 120 has a top portion (or lid) that extends (or bends) over and is directly disposed on the top portions of the outer edges of the package substrate 105. In these embodiments, the conductive stiffener 120 may be conductively coupled to a ground source (or the Vss) of the substrate 102, where the conductive structure (or frame) of the conductive stiffener 120 is thus grounded to avoid acting as an antenna, substantially reduce the EMI/RFI risks and signal integrity (SI) risks, and significantly mitigate (or decrease) electrostatic discharge (ESD) noise and signal crosstalk. The conductive structure (or frame) of the conductive stiffener 120 may be customized based on the desired dies, package substrates, and/or substrates to provide the necessary mechanical characteristics needed to avert thermal and reliability issues for the semiconductor packages. Also, the conductive structure of the conductive stiffener 120 may be implemented for BGA products (or the like) to provide improved package warpage control, reduced height/thickness variations, impeded EMI/RFI/SI risks, improved solder interconnect reliability, and decreased ball count of NCTF solder balls.

As described above, in one embodiment, the conductive stiffener 120 may be implemented (or designed) as a conductive picture frame, while in other embodiments as having different shapes, frames, structures, etc. (e.g., as shown with the conductive stiffeners of FIGS. 3A-3C). For one embodiment, the conductive stiffener 120 may have a thickness of approximately 150 um to 500 um. In another embodiment, the conductive stiffener 120 may have a thickness that is approximately 150 um or less. Additionally, in some embodiments, the conductive stiffener 120 may have a width of approximately 15 mm to 55 mm. In another embodiment, the conductive stiffener 120 may have a width that is approximately 15 mm or less. Furthermore, in some embodiments, the conductive stiffener 120 may have a length of approximately 15 mm to 55 mm. In another embodiment, the conductive stiffener 120 may have a length that is approximately 15 mm or less.

In some embodiments, the conductive stiffeners 120 may be formed using materials such as metals (e.g., copper (Cu), aluminum (Al), titanium (Ti), nickel (Ni), etc.), metal alloys (e.g., stainless steel), metal/ceramic composites (e.g., Cu/diamond, Cu/alumina), and/or any combination thereof. In alternate embodiments, the conductive stiffener 120 may be formed with polymers, polymer-metals, and/or polymer-ceramic composites (e.g., metal-filled or ceramic-filled polymers or resins, epoxy molding compounds, etc.), which may be patterned to the desired shape using dispensing/molding processes (e.g., compression molding), stamping processes, or the like. For alternative embodiments, the dies 110 may also be formed with one or more layers of different materials with the desired thermomechanical properties (e.g., epoxy, metal, ceramic, nanocrystalline powders, etc.), which may be produced/formed through any of the processes described herein (or in which some of the layers are picked and placed as discrete components).

Note that the semiconductor package 100 may include fewer or additional packaging components based on the desired packaging design.

Referring now to FIG. 2A, a cross-sectional illustration of a semiconductor package 200 is shown, in accordance with an embodiment. The semiconductor package 200 may be substantially similar to the semiconductor package 100 described above in FIG. 1, with the exception that a plurality of dies 210-211 are disposed on the package substrate 205 and surrounded by the cavity 230 of the conductive stiffener 220. Whereas the single die 110 is disposed on the package substrate 105 and surrounded by the cavity 130 of the conductive stiffener 120 in FIG. 1, the two dies 210-211 (or two or more) are disposed on the package substrate 205 and surrounded by the cavity 230 of the conductive stiffener 220 in FIG. 2.

That is, as shown in both views of FIGS. 2A-2B, the package substrate 205 and the cavity 230 may both have a footprint (or an x-y area) that may house the two or more dies 210-211. As described above, the substrate 202, the package substrate 205, the dies 210-211, the conductive stiffener 220, the solder material 224, the plurality of solder balls 222, the plurality of solder balls 223, and the conductive pads 232 of the semiconductor package 200 may be substantially similar to the substrate 102, the package substrate 105, the die 110, the conductive stiffener 120, the solder material 124, the plurality of solder balls 122, the plurality of solder balls 123, and the conductive pads 132 of the semiconductor package 100 described above in FIG. 1.

Referring now to FIG. 2B, a plan illustration of the respective semiconductor package 200 is shown, in accordance with an embodiment. As shown with the top view illustration of FIG. 2B, the conductive stiffener 220 may have a top portion (or lid) that extends/disposes over the top portions of the outer edges of the package substrate 205, where the cavity 230 may be disposed (or patterned) into the top portion (or lid) of the conductive stiffener 220. In one embodiment, the top portion of the conductive stiffener 220 may have a plurality of inner walls (or edges) that form the footprint of the cavity 230, where the footprint of the cavity 230 is greater than the combined footprints of the dies 210-211. Furthermore, as shown below in FIG. 2C, the solder material 224 (or the like) may be disposed between the bottom portions of the conductive stiffener 220 and the conductive pads 232 of the substrate 202, where such solder material 224 may conductively couple (and/or ground) the conductive stiffener 220 to the conductive pads 232 of the substrate 202.

Figure 2C:
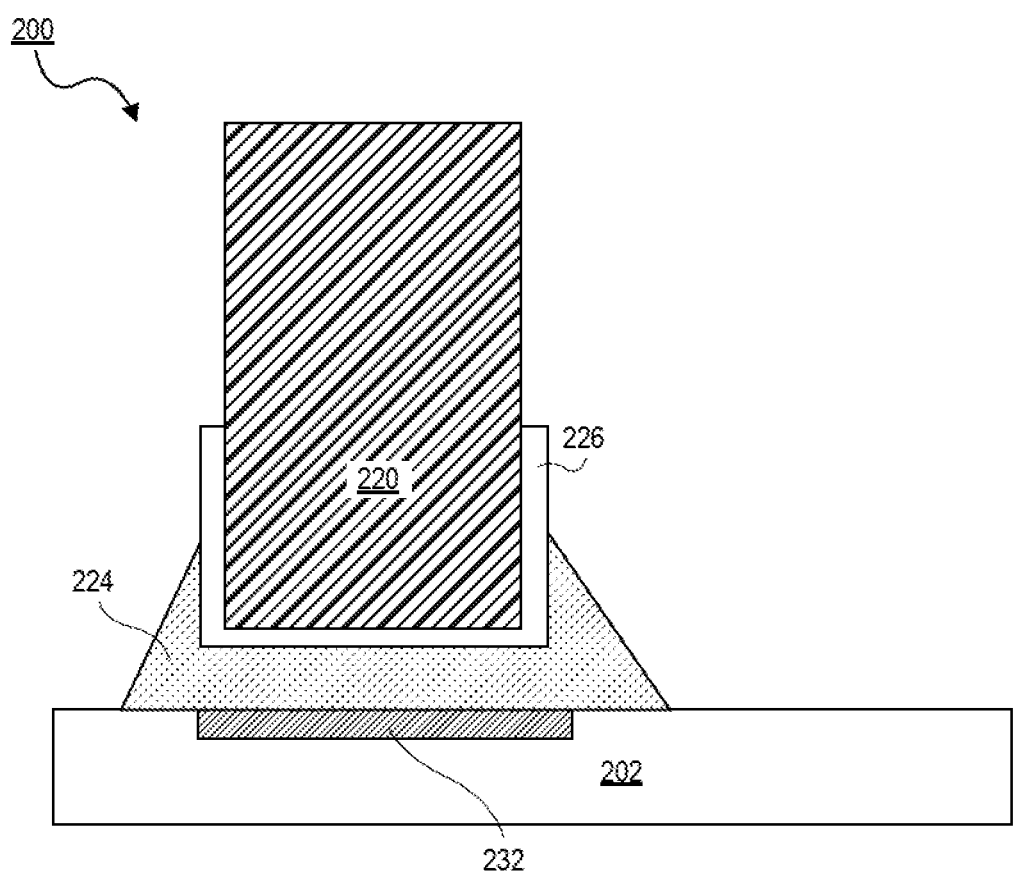
FIG. 2C is an illustration of a cross-sectional view of a portion of the respective conductive stiffener coupled to the plurality of conductive pads of the substrate, according to one embodiment.

Referring now to FIG. 2C, a perspective illustration of a detailed portion of the respective semiconductor package 200 is shown, in accordance with an embodiment. In particular, FIG. 2C illustrates the detailed portion of a bottom portion of the respective conductive stiffener 220. In some embodiments, the conductive stiffener 220 may include a conductive portion 226 that is positioned (or located) on the bottom portion of the conductive stiffener 220. In these embodiments, the conductive portion 226 of the conductive stiffener 220 may be conductively coupled to the conductive pads 232 (or the Vss pad(s)) of the substrate 202 with the solder material 224. For some embodiments, the conductive portion 226 may include, but is not limited to, one or more materials such as tin/lead formed with hot air solder leveling (HASL), electroless nickel immersion gold (ENIG), nickel/solder, and/or the like.

Note that the semiconductor package 200 of FIGS. 2A-2C may include fewer or additional packaging components based on the desired packaging design.

Figure 3C:
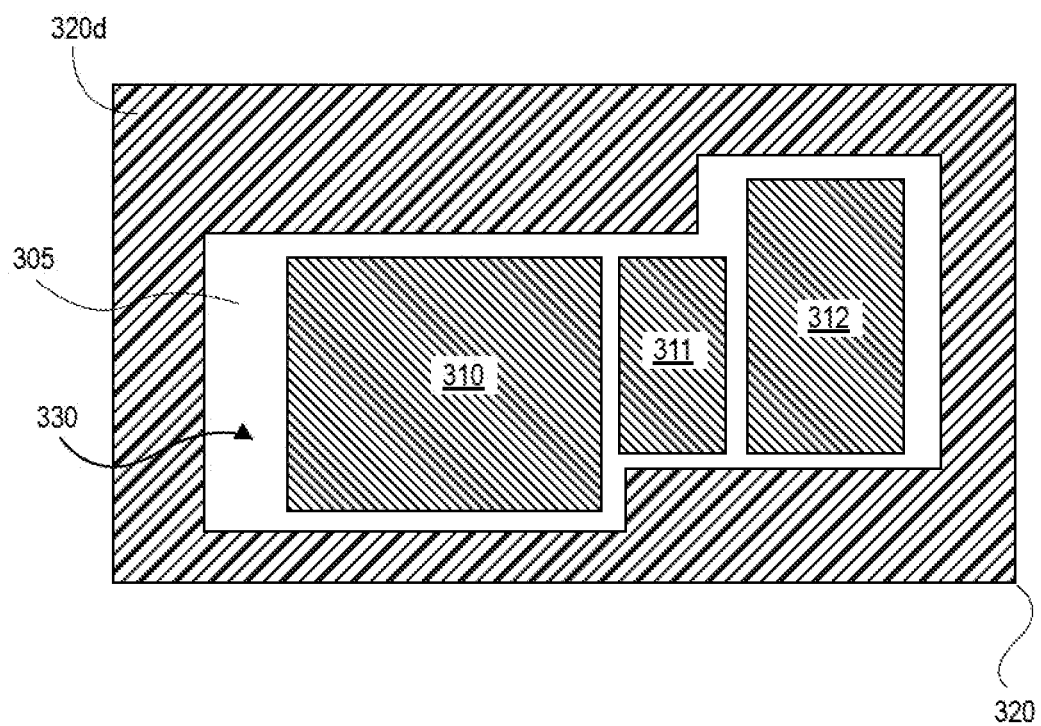

FIGS. 3A-3C are illustrations of perspective and plan views of a plurality of conductive stiffeners with one or more different shapes, in accordance with an embodiment. Referring now to FIG. 3A, a perspective illustration of a conductive stiffener 320 is shown, in accordance with an embodiment. The conductive stiffener 320 of FIG. 3A may be substantially similar to the conductive stiffener 120 described above in FIG. 1. That is, as shown in FIG. 1, the conductive stiffener 320 may be designed (or patterned/formed) as a picture frame conductive stiffener. In one embodiment, the conductive stiffener 320 may have a top portion 320a and a plurality of outer walls 320b that surround the cavity 330. Furthermore, as shown in FIG. 3A, the conductive stiffener 320 may have the top portion 320a (or the lid) positioned perpendicular to the outer walls 320b to form an "L" shaped-type of conductive enclosure (i.e., the picture frame conductive stiffener).

Referring now to FIG. 3B, a perspective illustration of a conductive stiffener 320 is shown, in accordance with an embodiment. The conductive stiffener 320 of FIG. 3B may be substantially similar to the conductive stiffener 120 described above in FIG. 1, with the exception that the plurality of legs 320c are vertically disposed (or coupled) below the top portion 320a. Whereas the conductive stiffener 120 of FIG. 1 has the outer walls vertically disposed below the top portion (e.g., similar to the outer walls 320b and the top portion 320a shown in FIG. 3A), the conductive stiffener 320 of FIG. 3B has the legs 320c vertically disposed and positioned below the top portion 320a. That is, as shown in FIG. 3B, the conductive stiffener 320 may be designed (or patterned/formed) as a picture frame conductive stiffener with legs and openings between each of the legs—rather than a picture frame conductive stiffener with outer walls with no openings. In one embodiment, the conductive stiffener 320 may have the top portion 320a and the legs 320c that surround the cavity 330. Furthermore, as shown in FIG. 3B, the conductive stiffener 320 may have the top portion 320a (or the lid) positioned perpendicular to the legs 320c to form an "L" shaped-type of conductive enclosure that has openings between the legs 320c.

Referring now to FIG. 3C, a plan illustration of a conductive stiffener 320 is shown, in accordance with an embodiment. The conductive stiffener 320 of FIG. 3C may be substantially similar to the conductive stiffener 120 described above in FIG. 1, with the exception that a top portion 320d is patterned with the cavity 330, and that the cavity 330 is patterned with a desired shape to surround the dies 310-312. Whereas the top portion of the conductive stiffener 120 of FIG. 1 has the cavity 130 patterned with a rectangular shape (e.g., similar to the rectangular shape of the cavity 330 shown in FIGS. 3A-3B), the top portion 320d of the conductive stiffener 320 of FIG. 3C has the cavity 330 with an uneven shape (i.e., not rectangular shape) to surround the dies 310-312 disposed on the package substrate 305. That is, as shown in FIG. 3C, the conductive stiffener 320 may be designed (or patterned/formed) as a picture frame conductive stiffener with an uneven-sided shaped/patterned cavity—rather than a picture frame conductive stiffener with a rectangular shaped cavity. In one embodiment, the top portion 320d of the conductive stiffener 320 may have a plurality of inner walls (or edges) that form a specified footprint of the cavity 330, where such specified footprint of the cavity 330 is greater than the combined footprints of the dies 310-312.

Note that the conductive stiffener 320 of FIGS. 3A-3C may include fewer or additional packaging components based on the desired packaging design.

Figure 4:
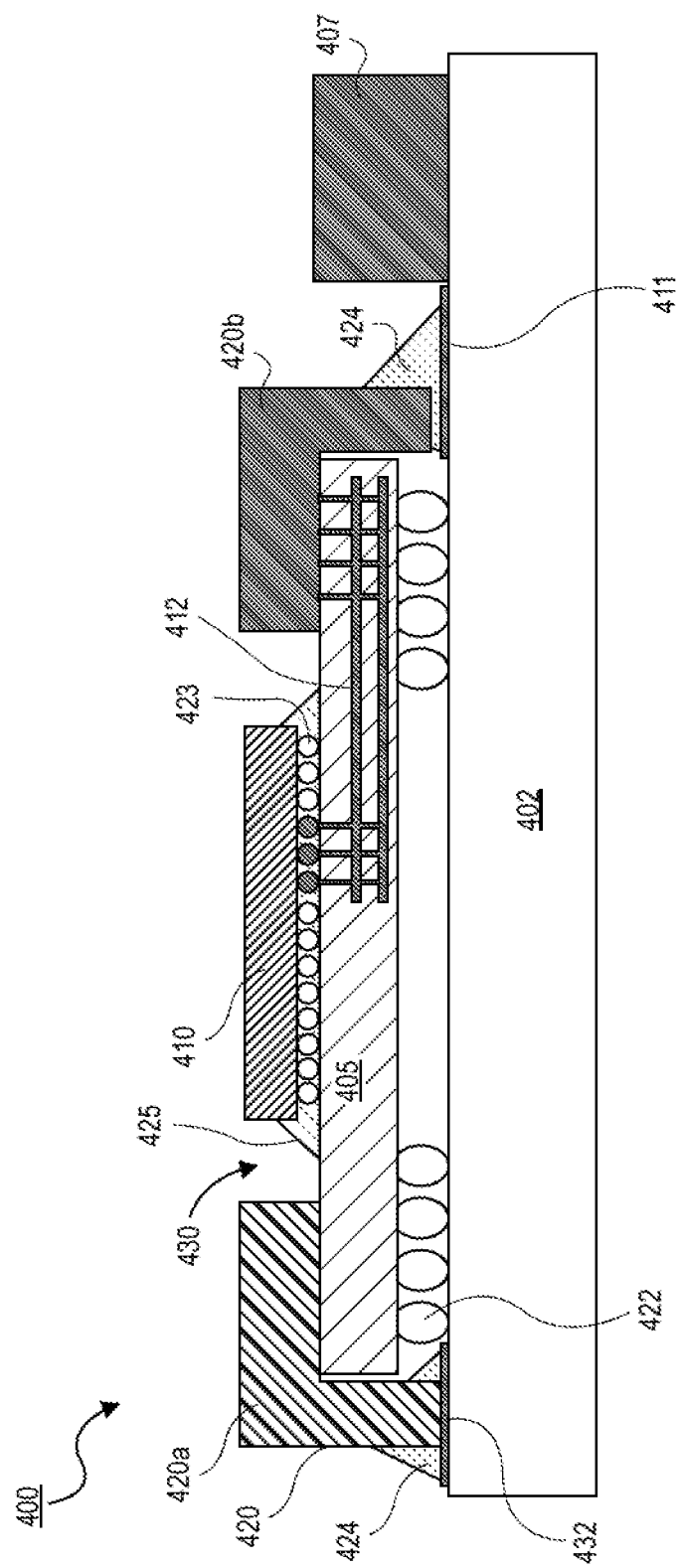
FIG. 4 is an illustration of a cross-sectional view of a semiconductor package with a package substrate, a substrate, a conductive stiffener, a voltage source, a die, and a plurality of conductive pads, where the conductive stiffener includes a feeding line to deliver power from the voltage source through the package substrate to the die, according to one embodiment.

Referring now to FIG. 4, a cross-sectional illustration of a semiconductor package 400 is shown, in accordance with an embodiment. The semiconductor package 400 may be substantially similar to the semiconductor package 100 described above in FIG. 1, with the exception that the conductive stiffener 420 has a plurality of first outer walls 420a and a plurality of second outer walls 420b, and that the second outer walls 420b is implemented to deliver (or feed) power to the package substrate 405 and the die 410. Whereas the conductive stiffener 120 in FIG. 1 is grounded and implemented for avoiding EMI/RFI risks, the conductive stiffener 420 in FIG. 4 may be grounded with the first outer walls 420a, while the second outer walls 420b may be coupled to a power source 407 to feed power to both the package substrate 405 and the die 410 through a conductive line 411. That is, as shown in FIG. 4, the power source 407 may deliver power through the conductive line 411 to the second outer walls 420b of the conductive stiffener 420, and the second outer walls 420b of the conductive stiffener 420 may respectively feed power through a plurality of interconnects 412 of the package substrate 405 to the die 410, according to one embodiment.

Furthermore, as described above, the substrate 402, the package substrate 405, the die 410, the solder material 424, the solder material 425, the plurality of solder balls 422, the plurality of solder balls 423, and the conductive pads 432 of the semiconductor package 400 may be substantially similar to the substrate 102, the package substrate 105, the die 110, the conductive stiffener 120, the solder material 124, the solder material 125, the plurality of solder balls 122, the plurality of solder balls 123, and the conductive pads 132 of the semiconductor package 100 described above in FIG. 1. Likewise, the conductive stiffener 420 may be similar to the conductive stiffener 120 described above in FIG. 1, with the exception that the second outer walls 420b may be conductively coupled to the power source 407 (i) to deliver/feed power into the package substrate 405, and (ii) to substantially reduce (or free up) the solder balls 422, such as the BGA power solder balls, positioned (or located) below the package substrate 405 to subsequently enable a smaller size for the package substrate 405.

In one embodiment, the power source 407 may be comprised of a voltage regulator, a capacitor, and/or the like. For one embodiment, the power source 407 with the conductive line 411 may be disposed on/in the substrate 402 to supply power to the second outer walls 420b of the conductive stiffener 420 and the package substrate 405, while the conductive pad(s) 432 disposed on the substrate 402 may be coupled to a ground source (or the Vss) to ground the first outer walls 420a of the conductive stiffener 420. In some embodiments, the first outer walls 420a may be similar to the second outer walls 420b, with the exception that a portion(s) of the second outer walls 420b is/are used to feed power while the first outer walls 420a are used for grounding.

Note that the semiconductor package 400 may include fewer or additional packaging components based on the desired packaging design.

Figure 5:
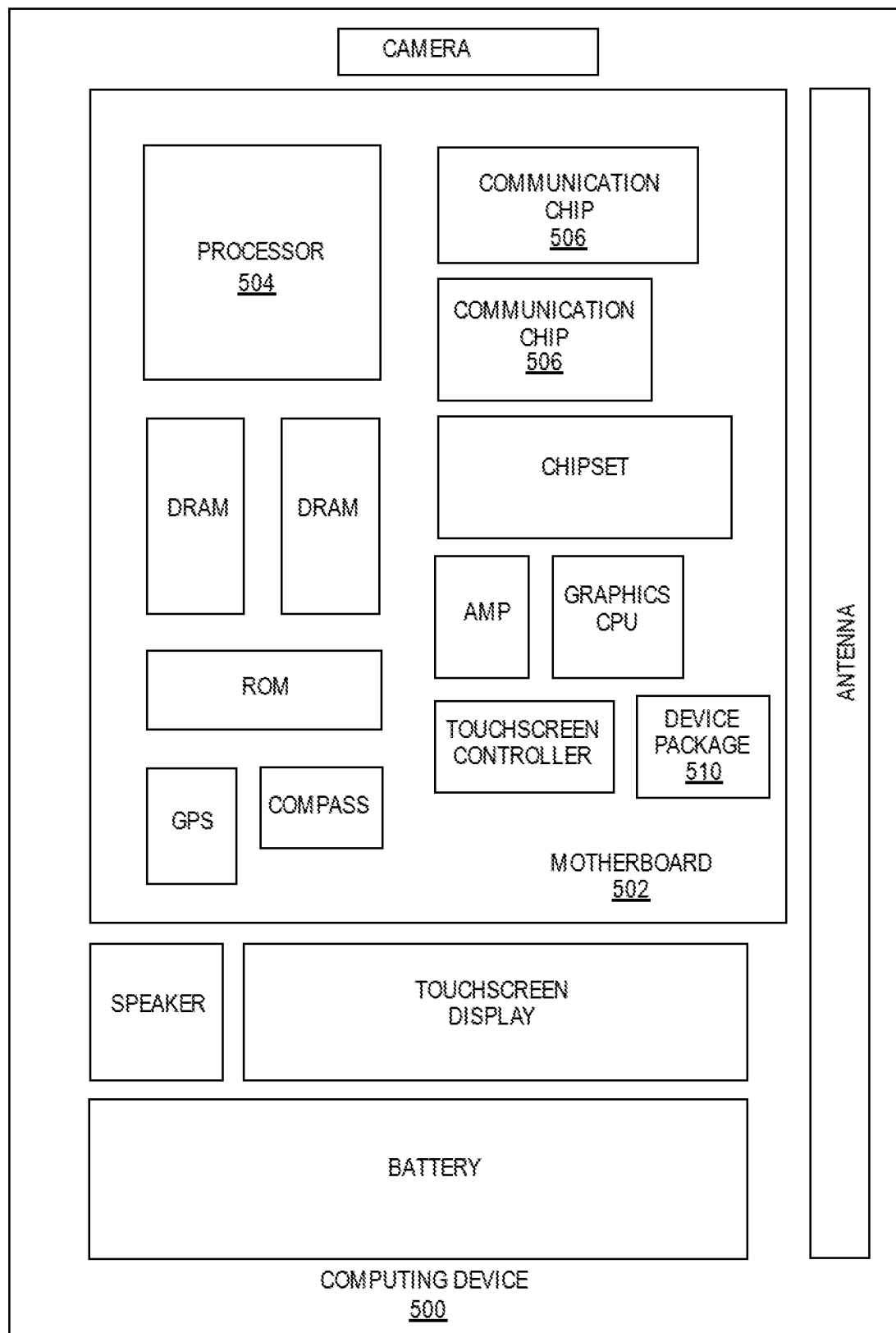
FIG. 5 is an illustration of a schematic block diagram illustrating a computer system that utilizes a device package with a package substrate, a substrate, a conductive stiffener, a die, and a plurality of conductive pads, where the conductive stiffener is coupled to the package substrate to the plurality of conductive pads of the substrate, according to one embodiment.

FIG. 5 is an illustration of a schematic block diagram illustrating a computer system 500 that utilizes a device package 510 (or a semiconductor package) with a package substrate, a substrate, a conductive stiffener, a die, and a plurality of conductive pads, where the conductive stiffener is coupled to the package substrate to the plurality of conductive pads of the substrate, according to one embodiment. FIG. 5 illustrates an example of computing device 500. Computing device 500 houses a motherboard 502. Motherboard 502 may include a number of components, including but not limited to processor 504, device package 510 (or semiconductor package), and at least one communication chip 506. Processor 504 is physically and electrically coupled to motherboard 502. For some embodiments, at least one communication chip 506 is also physically and electrically coupled to motherboard 502. For other embodiments, at least one communication chip 506 is part of processor 504.

Depending on its applications, computing device 500 may include other components that may or may not be physically and electrically coupled to motherboard 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 506 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 506 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

Processor 504 of computing device 500 includes an integrated circuit die packaged within processor 504. Device package 510 may be, but is not limited to, a substrate, a package substrate, and/or a PCB. In one embodiment, device package 510 may be substantially similar to the semiconductor packages 100, 200, and 400 of FIGS. 1, 2A-2C, and 4 described herein. Device package 510 may include picture frame conductive stiffeners (or the like) for avoiding EMI/RFI risks and so on (e.g., as illustrated and described above with the conductive stiffeners in FIGS. 1-4)—or any other components from the figures described herein.

Note that device package 510 may be a single component/device, a subset of components, and/or an entire system, as the materials, features, and components may be limited to device package 510 and/or any other component of the computing device 500 that may need the conductive stiffeners as described herein (e.g., the motherboard 502, the processor 504, and/or any other component of the computing device 500 that may need the embodiments of the semiconductor packages as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 506 also includes an integrated circuit die packaged within the communication chip 506. For some embodiments, the integrated circuit die of the communication chip 506 may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a semiconductor package, comprising: a package substrate on a substrate; a die on the package substrate; and a conductive stiffener over the package substrate and the substrate, wherein the conductive stiffener surrounds the package substrate, wherein the conductive stiffener has a top portion and a plurality of sidewalls, and wherein the top portion is directly disposed on the package substrate, and the plurality of sidewalls are vertically disposed on the substrate.

In example 2, the subject matter of example 1 can optionally include that the substrate has a plurality of conductive pads, and wherein the plurality of conductive pads are conductively coupled to a ground source.

In example 3, the subject matter of examples 1-2 can optionally include that the conductive stiffener conductively couples the package substrate to the plurality of conductive pads of the substrate.

In example 4, the subject matter of examples 1-3 can optionally include that the top portion of the conductive stiffener has a cavity that surrounds the die, and wherein the top portion of the conductive stiffener is directly disposed on a plurality of outer edges of the package substrate.

In example 5, the subject matter of examples 1-4 can optionally include a plurality of first solder balls coupled to the die and the package substrate; a plurality of second solder balls coupled to the package substrate and the substrate; a solder material coupled to the plurality of sidewalls of the conductive stiffener and the plurality of conductive pads of the substrate; and an underfill material between the die and the package substrate, wherein the underfill material surrounds the plurality of first solder balls.

In example 6, the subject matter of examples 1-5 can optionally include that the conductive stiffener has a plurality of conductive portions, wherein the plurality of conductive portions are positioned on a bottom portion of the plurality of sidewalls, and wherein the conductive portions are conductively coupled to the plurality of sidewalls of the conductive stiffener, the solder material, and the plurality of conductive pads of the substrate.

In example 7, the subject matter of examples 1-6 can optionally include that the conductive stiffener is a picture frame conductive stiffener.

In example 8, the subject matter of example 1-7 can optionally include a power source on the substrate, wherein the power source includes a capacitor or a voltage regulator; and a conductive line conductively coupled to the power source and a portion of the conductive stiffener; and a plurality of interconnects conductively coupling the power source to the portion of the conductive stiffener and the die.

In example 9, the subject matter of examples 1-8 can optionally include that the plurality of sidewalls include a plurality of first sidewalls or a plurality of second sidewalls, wherein the plurality of first sidewalls continuously extend alongside a plurality of sidewalls of the package substrate, and wherein the plurality of second sidewalls include a plurality of legs and a plurality of openings between the plurality of legs.

Example 10 is a method to form a semiconductor package, comprising: disposing a package substrate on a substrate; disposing a die on the package substrate; and disposing a conductive stiffener over the package substrate and the substrate, wherein the conductive stiffener surrounds the package substrate, wherein the conductive stiffener has a top portion and a plurality of sidewalls, and wherein the top portion is directly disposed on the package substrate, and the plurality of sidewalls are vertically disposed on the substrate.

In example 11, the subject matter of example 10 can optionally include that the substrate has a plurality of conductive pads, and wherein the plurality of conductive pads are conductively coupled to a ground source.

In example 12, the subject matter of examples 10-11 can optionally include that the conductive stiffener conductively couples the package substrate to the plurality of conductive pads of the substrate.

In example 13, the subject matter of examples 10-12 can optionally include that the top portion of the conductive stiffener has a cavity that surrounds the die, and wherein the top portion of the conductive stiffener is directly disposed on a plurality of outer edges of the package substrate.

In example 14, the subject matter of examples 10-13 can optionally include disposing a plurality of first solder balls between the die and the package substrate, wherein the plurality of first solder balls conductively couple the die to the package substrate; disposing a plurality of second solder balls between the package substrate and the substrate, wherein the plurality of second solder balls conductively couple the package substrate to the substrate; disposing a solder material between the plurality of sidewalls of the conductive stiffener and the plurality of conductive pads of the substrate, wherein the solder material conductively couples the plurality of sidewalls of the conductive stiffener to the plurality of conductive pads of the substrate; and disposing an underfill material between the die and the package substrate, wherein the underfill material surrounds the plurality of first solder balls.

In example 15, the subject matter of examples 10-14 can optionally include that the conductive stiffener has a plurality of conductive portions, wherein the plurality of conductive portions are positioned on a bottom portion of the plurality of sidewalls, and wherein the conductive portions are conductively coupled to the plurality of sidewalls of the conductive stiffener, the solder material, and the plurality of conductive pads of the substrate.

In example 16, the subject matter of examples 10-15 can optionally include that the conductive stiffener is a picture frame conductive stiffener.

In example 17, the subject matter of examples 10-16 can optionally include that disposing a power source on the substrate, wherein the power source includes a capacitor or a voltage regulator; and disposing a conductive line on the substrate, wherein the conductive line conductive couples the power source to a portion of the conductive stiffener; and disposing a plurality of interconnects in the package substrate, wherein the plurality of interconnects conductive couples the power source to the portion of the conductive stiffener and the die.

In example 18, the subject matter of examples 10-17 can optionally include that the plurality of sidewalls include a plurality of first sidewalls or a plurality of second sidewalls, wherein the plurality of first sidewalls continuously extend alongside a plurality of sidewalls of the package substrate, and wherein the plurality of second sidewalls include a plurality of legs and a plurality of openings between the plurality of legs.

Example 19 is a semiconductor package, comprising: a package substrate on a substrate; a power source with a conductive line on the substrate; a plurality of dies on the package substrate; and a conductive stiffener over the package substrate and the substrate, wherein the conductive stiffener surrounds the package substrate, wherein the conductive stiffener has a top portion and a plurality of sidewalls, wherein the plurality of sidewalls includes a plurality of first sidewalls and a plurality of sidewalls, wherein the top portion is directly disposed on the package substrate, the plurality of sidewalls are vertically disposed on the substrate, and wherein the conductive line conductively couples the power source to the plurality of second sidewalls of the conductive stiffener.

In example 20, the subject matter of example 19 can optionally include that the substrate has a plurality of conductive pads, and wherein the plurality of conductive pads are conductively coupled to a ground source.

In example 21, the subject matter of examples 19-20 can optionally include that the plurality of first sidewalls of the conductive stiffener conductively couple the package substrate to the plurality of conductive pads of the substrate.

In example 22, the subject matter of examples 19-21 can optionally include that the top portion of the conductive stiffener has a cavity that surrounds the plurality of dies, and wherein the top portion of the conductive stiffener is directly disposed on a plurality of outer edges of the package substrate.

In example 23, the subject matter of examples 19-22 can optionally include that a plurality of first solder balls coupled to the plurality of dies and the package substrate; a plurality of second solder balls coupled to the package substrate and the substrate; a solder material coupled to the plurality of sidewalls of the conductive stiffener and the plurality of conductive pads of the substrate; and an underfill material between the plurality of dies and the package substrate, wherein the underfill material surrounds the plurality of first solder balls.

In example 24, the subject matter of examples 19-23 can optionally include that the conductive stiffener has a plurality of conductive portions, wherein the plurality of conductive portions are positioned on a bottom portion of the plurality of sidewalls, wherein the conductive portions are conductively coupled to the plurality of sidewalls of the conductive stiffener, the solder material, and the plurality of conductive pads of the substrate, and wherein the conductive stiffener is a picture frame conductive stiffener.

In example 25, the subject matter of examples 19-24 can optionally include a plurality of interconnects conductively coupling the conductive line of the power source to the plurality of second sidewalls of the conductive stiffener and the plurality of dies, and wherein the power source includes a capacitor or a voltage regulator.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A semiconductor package, comprising:
   a package substrate on a substrate;
   a die on the package substrate; and
   a conductive stiffener over the package substrate and the substrate, wherein the conductive stiffener surrounds the package substrate, wherein the conductive stiffener has a top portion and a plurality of sidewalls, and wherein the top portion is directly disposed on and conductively coupled to the package substrate to provide power to the package substrate, and the plurality of sidewalls are vertically adjacent to the substrate.

2. The semiconductor package of claim 1, wherein the substrate has a plurality of conductive pads, and wherein the plurality of conductive pads are conductively coupled to a ground source.

3. The semiconductor package of claim 2, wherein the conductive stiffener conductively couples the package substrate to the plurality of conductive pads of the substrate.

4. The semiconductor package of claim 1, wherein the top portion of the conductive stiffener has a cavity that surrounds the die, and wherein the top portion of the conductive stiffener is directly disposed on a plurality of outer edges of the package substrate.

5. The semiconductor package of claim 1, further comprising:
   a plurality of first solder balls coupled to the die and the package substrate;
   a plurality of second solder balls coupled to the package substrate and the substrate;
   a solder material coupled to the plurality of sidewalls of the conductive stiffener and the plurality of conductive pads of the substrate; and
   an underfill material between the die and the package substrate, wherein the underfill material surrounds the plurality of first solder balls.

6. The semiconductor package of claim 5, wherein the conductive stiffener has a plurality of conductive portions, wherein the plurality of conductive portions are positioned on a bottom portion of the plurality of sidewalls, and wherein the conductive portions are conductively coupled to the plurality of sidewalls of the conductive stiffener, the solder material, and the plurality of conductive pads of the substrate.

7. The semiconductor package of claim 1, wherein the conductive stiffener is a picture frame conductive stiffener.

8. The semiconductor package of claim 1, further comprising:
   a power source on the substrate, wherein the power source includes a capacitor or a voltage regulator; and
   a conductive line conductively coupled to the power source and a portion of the conductive stiffener; and
   a plurality of interconnects conductively coupling the power source to the portion of the conductive stiffener and the die.

9. The semiconductor package of claim 1, wherein the plurality of sidewalls include a plurality of first sidewalls or a plurality of second sidewalls, wherein the plurality of first sidewalls continuously extend alongside a plurality of sidewalls of the package substrate, and wherein the plurality of second sidewalls include a plurality of legs and a plurality of openings between the plurality of legs.

10. A method to form a semiconductor package, comprising:
    disposing a package substrate on a substrate;
    disposing a die on the package substrate; and
    disposing a conductive stiffener over the package substrate and the substrate, wherein the conductive stiffener surrounds the package substrate, wherein the conductive stiffener has a top portion and a plurality of sidewalls, and wherein the top portion is directly disposed on and conductively coupled to the package substrate to provide power to the package substrate, and the plurality of sidewalls are vertically adjacent to the substrate.

11. The method of claim 10, wherein the substrate has a plurality of conductive pads, and wherein the plurality of conductive pads are conductively coupled to a ground source.

12. The method of claim 11, wherein the conductive stiffener conductively couples the package substrate to the plurality of conductive pads of the substrate.

13. The method of claim 10, wherein the top portion of the conductive stiffener has a cavity that surrounds the die, and wherein the top portion of the conductive stiffener is directly disposed on a plurality of outer edges of the package substrate.

14. The method of claim 10, further comprising:
    disposing a plurality of first solder balls between the die and the package substrate, wherein the plurality of first solder balls conductively couple the die to the package substrate;
    disposing a plurality of second solder balls between the package substrate and the substrate, wherein the plurality of second solder balls conductively couple the package substrate to the substrate;
    disposing a solder material between the plurality of sidewalls of the conductive stiffener and the plurality of conductive pads of the substrate, wherein the solder material conductively couples the plurality of sidewalls of the conductive stiffener to the plurality of conductive pads of the substrate; and
    disposing an underfill material between the die and the package substrate, wherein the underfill material surrounds the plurality of first solder balls.

15. The method of claim 14, wherein the conductive stiffener has a plurality of conductive portions, wherein the plurality of conductive portions are positioned on a bottom portion of the plurality of sidewalls, and wherein the conductive portions are conductively coupled to the plurality of sidewalls of the conductive stiffener, the solder material, and the plurality of conductive pads of the substrate.

16. The method of claim 10, wherein the conductive stiffener is a picture frame conductive stiffener.

17. The method of claim 10, further comprising:
disposing a power source on the substrate, wherein the power source includes a capacitor or a voltage regulator; and
disposing a conductive line on the substrate, wherein the conductive line conductive couples the power source to a portion of the conductive stiffener; and
disposing a plurality of interconnects in the package substrate, wherein the plurality of interconnects conductive couples the power source to the portion of the conductive stiffener and the die.

18. The method of claim 10, wherein the plurality of sidewalls include a plurality of first sidewalls or a plurality of second sidewalls, wherein the plurality of first sidewalls continuously extend alongside a plurality of sidewalls of the package substrate, and wherein the plurality of second sidewalls include a plurality of legs and a plurality of openings between the plurality of legs.

19. A semiconductor package, comprising:
a package substrate on a substrate;
a power source with a conductive line on the substrate;
a plurality of dies on the package substrate; and
a conductive stiffener over the package substrate and the substrate, wherein the conductive stiffener surrounds the package substrate, wherein the conductive stiffener has a top portion and a plurality of sidewalls, wherein the plurality of sidewalls includes a plurality of first sidewalls and a plurality of sidewalls, wherein the top portion is directly disposed on the package substrate, the plurality of sidewalls are vertically disposed on the substrate, and wherein the conductive line conductively couples the power source to the plurality of second sidewalls of the conductive stiffener.

20. The semiconductor package of claim 19, wherein the substrate has a plurality of conductive pads, and wherein the plurality of conductive pads are conductively coupled to a ground source.

21. The semiconductor package of claim 20, wherein the plurality of first sidewalls of the conductive stiffener conductively couple the package substrate to the plurality of conductive pads of the substrate.

22. The semiconductor package of claim 19, wherein the top portion of the conductive stiffener has a cavity that surrounds the plurality of dies, and wherein the top portion of the conductive stiffener is directly disposed on a plurality of outer edges of the package substrate.

23. The semiconductor package of claim 19, further comprising:
a plurality of first solder balls coupled to the plurality of dies and the package substrate;
a plurality of second solder balls coupled to the package substrate and the substrate;
a solder material coupled to the plurality of sidewalls of the conductive stiffener and the plurality of conductive pads of the substrate; and
an underfill material between the plurality of dies and the package substrate, wherein the underfill material surrounds the plurality of first solder balls.

24. The semiconductor package of claim 19, wherein the conductive stiffener has a plurality of conductive portions, wherein the plurality of conductive portions are positioned on a bottom portion of the plurality of sidewalls, wherein the conductive portions are conductively coupled to the plurality of sidewalls of the conductive stiffener, the solder material, and the plurality of conductive pads of the substrate, and wherein the conductive stiffener is a picture frame conductive stiffener.

25. The semiconductor package of claim 19, further comprising a plurality of interconnects conductively coupling the conductive line of the power source to the plurality of second sidewalls of the conductive stiffener and the plurality of dies, and wherein the power source includes a capacitor or a voltage regulator.

26. A semiconductor package, comprising:
a package substrate on a substrate;
a die on the package substrate;
a conductive stiffener over the package substrate and the substrate, wherein the conductive stiffener surrounds the package substrate, wherein the conductive stiffener has a top portion and a plurality of sidewalls, and wherein the top portion is directly disposed on the package substrate, and the plurality of sidewalls are vertically disposed on the substrate;
a plurality of first solder balls coupled to the die and the package substrate;
a plurality of second solder balls coupled to the package substrate and the substrate;
a solder material coupled to the plurality of sidewalls of the conductive stiffener and the plurality of conductive pads of the substrate; and
an underfill material between the die and the package substrate, wherein the underfill material surrounds the plurality of first solder balls, wherein the conductive stiffener has a plurality of conductive portions, wherein the plurality of conductive portions are positioned on a bottom portion of the plurality of sidewalls, and wherein the conductive portions are conductively coupled to the plurality of sidewalls of the conductive stiffener, the solder material, and the plurality of conductive pads of the substrate.

27. A semiconductor package, comprising:
a package substrate on a substrate;
a die on the package substrate;
a conductive stiffener over the package substrate and the substrate, wherein the conductive stiffener surrounds the package substrate, wherein the conductive stiffener has a top portion and a plurality of sidewalls, and wherein the top portion is directly disposed on the package substrate, and the plurality of sidewalls are vertically disposed on the substrate;
a power source on the substrate, wherein the power source includes a capacitor or a voltage regulator;
a conductive line conductively coupled to the power source and a portion of the conductive stiffener; and
a plurality of interconnects conductively coupling the power source to the portion of the conductive stiffener and the die.

28. A semiconductor package, comprising:
a package substrate on a substrate;
a die on the package substrate; and
a conductive stiffener over the package substrate and the substrate, wherein the conductive stiffener surrounds the package substrate, wherein the conductive stiffener has a top portion and a plurality of sidewalls, and wherein the top portion is directly disposed on the package substrate, and the plurality of sidewalls are vertically disposed on the substrate, wherein the plurality of sidewalls include a plurality of first sidewalls or a plurality of second sidewalls, wherein the plurality of first sidewalls continuously extend alongside a plurality of sidewalls of the package substrate, and wherein the plurality of second sidewalls include a plurality of legs and a plurality of openings between the plurality of legs.

* * * * *